United States Patent
Mustafa et al.

(10) Patent No.: US 11,236,424 B2
(45) Date of Patent: Feb. 1, 2022

(54) PROCESS KIT FOR IMPROVING EDGE FILM THICKNESS UNIFORMITY ON A SUBSTRATE

(71) Applicant: APPLIED MATERIALS, INC., Santa Clara, CA (US)

(72) Inventors: Muhannad Mustafa, Santa Clara, CA (US); Muhammad M Rasheed, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 178 days.

(21) Appl. No.: 16/672,327

(22) Filed: Nov. 1, 2019

(65) Prior Publication Data

US 2021/0130953 A1  May 6, 2021

(51) Int. Cl.
| | | |
|---|---|---|
| *C23C 16/40* | (2006.01) | |
| *C23C 16/458* | (2006.01) | |
| *C23C 16/46* | (2006.01) | |
| *C23C 16/44* | (2006.01) | |
| *C23C 16/455* | (2006.01) | |

(52) U.S. Cl.
CPC ...... *C23C 16/4585* (2013.01); *C23C 16/4412* (2013.01); *C23C 16/45544* (2013.01); *C23C 16/45565* (2013.01); *C23C 16/46* (2013.01)

(58) Field of Classification Search
CPC . C23C 16/4585; C23C 16/46; C23C 16/4412; C23C 16/45544; C23C 16/45565; C23C 16/4401
USPC ........................ 118/715; 156/345.33, 345.34
See application file for complete search history.

(56) References Cited

U.S. PATENT DOCUMENTS

| | | | | | |
|---|---|---|---|---|---|
| 5,338,363 | A | * | 8/1994 | Kawata | ............. C23C 16/45512 118/715 |
| 5,445,677 | A | * | 8/1995 | Kawata | .................. C23C 16/04 118/724 |
| 5,582,866 | A | * | 12/1996 | White | ................ C23C 16/4407 118/715 |
| 5,844,195 | A | * | 12/1998 | Fairbairn | .......... H01L 21/67017 219/121.43 |
| 5,855,681 | A | * | 1/1999 | Maydan | ............ H01L 21/67742 118/719 |
| 5,902,088 | A | * | 5/1999 | Fairbairn | .......... H01L 21/67754 414/217 |

(Continued)

OTHER PUBLICATIONS

International Search Report and Written Opinion for PCT/US2020/057790 dated Feb. 19, 2021.

*Primary Examiner* — Rudy Zervigon
(74) *Attorney, Agent, or Firm* — Moser Taboada

(57) ABSTRACT

Embodiments of process kits for us in a substrate processing chamber are provided herein. In some embodiments, a process kit for use in a substrate processing chamber includes an annular body configured to surround a substrate support and having an upper portion, a lower portion, and a central opening through the upper portion and the lower portion, wherein the upper portion includes sidewalls coupled to an upper flange that defines an outer diameter of the annular body, wherein the upper portion includes a plurality of first holes disposed through the sidewalls, and wherein the upper portion includes one or more heating elements; and a shield disposed about the annular body, wherein the shield includes an exhaust port fluidly connected to the plurality of first holes.

17 Claims, 5 Drawing Sheets

(56) References Cited

U.S. PATENT DOCUMENTS

| | | | |
|---|---|---|---|
| 5,911,834 A * | 6/1999 | Fairbairn | C23C 16/45572 134/1.3 |
| 6,063,441 A | 5/2000 | Koai et al. | |
| 6,248,398 B1 * | 6/2001 | Talieh | G03F 7/162 427/240 |
| 6,413,321 B1 * | 7/2002 | Kim | C23C 16/0209 118/719 |
| 6,591,850 B2 * | 7/2003 | Rocha-Alvarez | G05D 7/0635 137/101 |
| 6,630,053 B2 * | 10/2003 | Yamagishi | H01L 21/67173 118/719 |
| 6,635,115 B1 * | 10/2003 | Fairbairn | H01L 21/67017 118/719 |
| 6,772,827 B2 * | 8/2004 | Keller | C23C 16/455 118/715 |
| 6,777,352 B2 * | 8/2004 | Tepman | C23C 16/4412 118/696 |
| 7,429,410 B2 * | 9/2008 | Keller | H01J 37/3244 427/578 |
| 8,074,599 B2 * | 12/2011 | Choi | H01J 37/3244 118/723 R |
| 8,083,853 B2 * | 12/2011 | Choi | H01J 37/32082 118/715 |
| 8,097,082 B2 * | 1/2012 | Zhou | C23C 16/5096 117/200 |
| 8,506,713 B2 * | 8/2013 | Takagi | C23C 16/45574 118/715 |
| 8,709,162 B2 * | 4/2014 | Leung | C23C 16/463 118/728 |
| 8,945,306 B2 * | 2/2015 | Tsuda | C23C 16/45559 118/715 |
| 9,914,999 B2 | 3/2018 | Rasheed et al. | |
| 10,460,949 B2 * | 10/2019 | Takahashi | H01L 21/6719 |
| 10,867,786 B2 * | 12/2020 | Choi | H01L 21/02274 |
| 10,867,819 B2 * | 12/2020 | Yamagishi | H01L 21/67017 |
| 2001/0004478 A1 | 6/2001 | Zhao et al. | |
| 2001/0039922 A1 * | 11/2001 | Nakahara | C23C 16/4412 118/715 |
| 2003/0097987 A1 * | 5/2003 | Fukuda | H01J 37/32082 118/723 E |
| 2003/0213560 A1 * | 11/2003 | Wang | H01L 21/67017 156/345.31 |
| 2004/0071874 A1 * | 4/2004 | Shimizu | C23C 16/4557 427/248.1 |
| 2005/0022737 A1 * | 2/2005 | Shimizu | C23C 16/4585 118/715 |
| 2005/0208217 A1 * | 9/2005 | Shinriki | C23C 16/34 427/248.1 |
| 2005/0229849 A1 | 10/2005 | Silvetti et al. | |
| 2005/0230350 A1 | 10/2005 | Kao et al. | |
| 2007/0254112 A1 * | 11/2007 | Takehara | B08B 7/0035 427/569 |
| 2009/0084317 A1 | 4/2009 | Wu et al. | |
| 2009/0314309 A1 * | 12/2009 | Sankarakrishnan | C23C 16/4409 134/1.1 |
| 2010/0147396 A1 * | 6/2010 | Yamagishi | H01L 21/67742 137/15.01 |
| 2010/0193132 A1 * | 8/2010 | Wi | H01L 21/6719 156/345.51 |
| 2010/0236406 A1 * | 9/2010 | Yamawaku | H01L 21/67017 95/58 |
| 2010/0272895 A1 * | 10/2010 | Tsuda | C23C 16/45514 427/255.32 |
| 2010/0279008 A1 * | 11/2010 | Takagi | C23C 16/4557 427/248.1 |
| 2010/0310772 A1 * | 12/2010 | Tsuda | C23C 16/409 427/255.28 |
| 2012/0009765 A1 * | 1/2012 | Olgado | C23C 16/45508 438/478 |
| 2013/0105085 A1 | 5/2013 | Yousif et al. | |
| 2014/0090599 A1 * | 4/2014 | Saitou | B05B 1/005 118/728 |
| 2014/0130743 A1 * | 5/2014 | Toriya | C23C 16/4412 118/725 |
| 2015/0047567 A1 * | 2/2015 | Saitou | C23C 16/45565 118/729 |
| 2015/0110959 A1 * | 4/2015 | Ashizawa | C23C 16/45544 427/255.391 |
| 2015/0170909 A1 * | 6/2015 | Sato | C23C 16/4408 438/778 |
| 2015/0221508 A1 * | 8/2015 | Kurita | H01L 29/66969 438/104 |
| 2015/0252479 A1 * | 9/2015 | Nakano | H01J 37/32091 438/680 |
| 2015/0361553 A1 * | 12/2015 | Murakawa | C23C 16/52 156/345.55 |
| 2016/0024650 A1 * | 1/2016 | Toyoda | C23C 16/45523 118/704 |
| 2016/0060755 A1 * | 3/2016 | Kamakura | C23C 16/46 156/345.29 |
| 2016/0153088 A1 * | 6/2016 | Tsuji | C23C 16/4412 118/728 |
| 2016/0181088 A1 * | 6/2016 | Ghosh | H01J 37/32477 438/778 |
| 2016/0237559 A1 * | 8/2016 | Tsuji | C23C 16/4412 |
| 2016/0307752 A1 | 10/2016 | Kulshreshtha et al. | |
| 2016/0319428 A1 * | 11/2016 | Rasheed | C23C 16/4404 |
| 2016/0379855 A1 * | 12/2016 | Fukasawa | H01L 21/67207 414/217 |
| 2017/0076964 A1 * | 3/2017 | Sawada | H01J 37/32522 |
| 2017/0218515 A1 * | 8/2017 | Shin | H01L 21/67017 |
| 2017/0263466 A1 * | 9/2017 | Ranish | H01L 21/67115 |
| 2017/0283947 A1 * | 10/2017 | Rasheed | C23C 16/509 |
| 2017/0314130 A1 * | 11/2017 | Hirose | C23C 16/4412 |
| 2017/0362704 A1 * | 12/2017 | Yamashita | C23C 16/45544 |
| 2018/0112309 A1 * | 4/2018 | Kamio | C23C 16/45565 |
| 2018/0112312 A1 * | 4/2018 | Odagiri | C23C 16/45574 |
| 2018/0261453 A1 * | 9/2018 | Ghosh | C23C 16/4412 |
| 2018/0308709 A1 * | 10/2018 | Yamasaki | C23C 16/00 |
| 2019/0035698 A1 * | 1/2019 | Tanaka | H01L 21/0217 |
| 2019/0122872 A1 * | 4/2019 | Ghosh | C23C 16/4408 |
| 2019/0198390 A1 * | 6/2019 | Itatani | H01J 37/3244 |
| 2019/0318910 A1 * | 10/2019 | Mori | H01L 21/67069 |
| 2019/0348299 A1 * | 11/2019 | Sakamoto | H01J 37/3244 |
| 2019/0355597 A1 * | 11/2019 | Mochizuki | H01L 21/823431 |
| 2019/0385873 A1 * | 12/2019 | Yamagishi | H01L 21/67184 |
| 2020/0010956 A1 * | 1/2020 | Toriya | C23C 16/4411 |
| 2020/0115797 A1 * | 4/2020 | Tsuji | C23C 16/50 |
| 2020/0126771 A1 * | 4/2020 | Roh | H01J 37/32715 |
| 2020/0126840 A1 * | 4/2020 | Roh | H01L 21/68735 |
| 2020/0234989 A1 * | 7/2020 | Jeong | H01L 21/68771 |
| 2020/0294842 A1 * | 9/2020 | Ikeda | H01J 37/32623 |
| 2020/0392622 A1 * | 12/2020 | Takahashi | C23C 16/4585 |
| 2021/0017642 A1 * | 1/2021 | Ishizaka | C23C 16/4488 |
| 2021/0035785 A1 * | 2/2021 | Jeong | C23C 16/4412 |
| 2021/0035786 A1 * | 2/2021 | Jeong | C23C 16/50 |
| 2021/0043447 A1 * | 2/2021 | Nozawa | H01L 21/02118 |
| 2021/0071296 A1 * | 3/2021 | Watarai | H01J 37/32834 |
| 2021/0074527 A1 * | 3/2021 | Lee | H01J 37/32449 |
| 2021/0130953 A1 * | 5/2021 | Mustafa | C23C 16/4401 |
| 2021/0156024 A1 * | 5/2021 | Roh | C23C 16/4412 |
| 2021/0166924 A1 * | 6/2021 | Moon | H01J 37/32642 |
| 2021/0166925 A1 * | 6/2021 | Moon | H01J 37/32715 |
| 2021/0189557 A1 * | 6/2021 | Itatani | C23C 16/4412 |
| 2021/0249239 A1 * | 8/2021 | Apurva | H01L 21/67069 |

* cited by examiner

PROCESS KIT FOR IMPROVING EDGE FILM THICKNESS UNIFORMITY ON A SUBSTRATE

FIELD

Embodiments of the present disclosure generally relate to substrate processing equipment, and more specifically, process kits for use in substrate processing equipment.

BACKGROUND

Deposition chambers are typically used to deposit material layers over featured formed on substrates. Atomic layer deposition (ALD) and chemical vapor deposition (CVD) are deposition techniques used for the deposition of material layers. One example of an ALD process includes the sequential introduction of pulses of gases. For instance, one cycle for the sequential introduction of pulses of gases may contain a pulse of a first reactant gas, followed by a pulse of a purge gas and/or a pump evacuation, followed by a pulse of a second reactant gas, and followed by a pulse of a purge gas and/or a pump evacuation. Sequential introduction of separate pulses of the first reactant and the second reactant may result in the alternating self-limiting absorption of monolayers of the reactants on the surface of the substrate and, thus, forms a monolayer of material for each cycle. The cycle may be repeated to a desired thickness of the deposited material. A pulse of a purge gas and/or a pump evacuation between the pulses of the first reactant gas and the pulses of the second reactant gas serves to reduce the likelihood of gas phase reactions of the reactants due to excess amounts of the reactants remaining in the chamber.

However, the inventors have observed that during some deposition processes, temperature non-uniformity at a peripheral region of a substrate being processed leads to a non-uniform thickness of deposited material across the substrate.

Therefore, the inventors have provided improved process kits for use in deposition chambers.

SUMMARY

Embodiments of process kits for us in a substrate processing chamber are provided herein. In some embodiments, a process kit for use in a substrate processing chamber includes an annular body configured to surround a substrate support and having an upper portion, a lower portion, and a central opening through the upper portion and the lower portion, wherein the upper portion includes sidewalls coupled to an upper flange that defines an outer diameter of the annular body, wherein the upper portion includes a plurality of first holes disposed through the sidewalls, and wherein the upper portion includes one or more heating elements; and a shield disposed about the annular body, wherein the shield includes an exhaust port fluidly connected to the plurality of first holes.

In some embodiments, a process kit for use in a substrate processing chamber includes an annular body configured to surround a substrate support and having an upper portion, a lower portion, and a central opening through the upper portion and the lower portion, wherein the upper portion includes a plurality of first holes disposed through sidewalls of the upper portion, and wherein the upper portion includes one or more heating elements; and a shield disposed about and removably coupled to the annular body, wherein the shield includes an exhaust port fluidly connected to the plurality of first holes, and wherein the annular body and the shield both include a cutout to accommodate a substrate therethrough.

In some embodiments, a process chamber includes a chamber body defining a processing volume, wherein the chamber body includes a lid; a substrate support disposed in the processing volume; an annular body disposed about the substrate support and having an upper portion, a lower portion, and a central opening through the upper portion and the lower portion, wherein the annular body includes a plurality of first holes disposed through sidewalls of the annular body, and wherein the upper portion includes one or more heating elements, wherein the one or more heating elements comprise at least one of a plurality of heater rods disposed axisymmetrically about the annular body or a resistive heater disposed in a ring coupled to the upper portion; a shield disposed about and removably coupled to the annular body, wherein the shield includes an exhaust port fluidly connected to the plurality of first holes; and a showerhead disposed in the processing volume opposite the substrate support and on an upper surface of the annular body.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
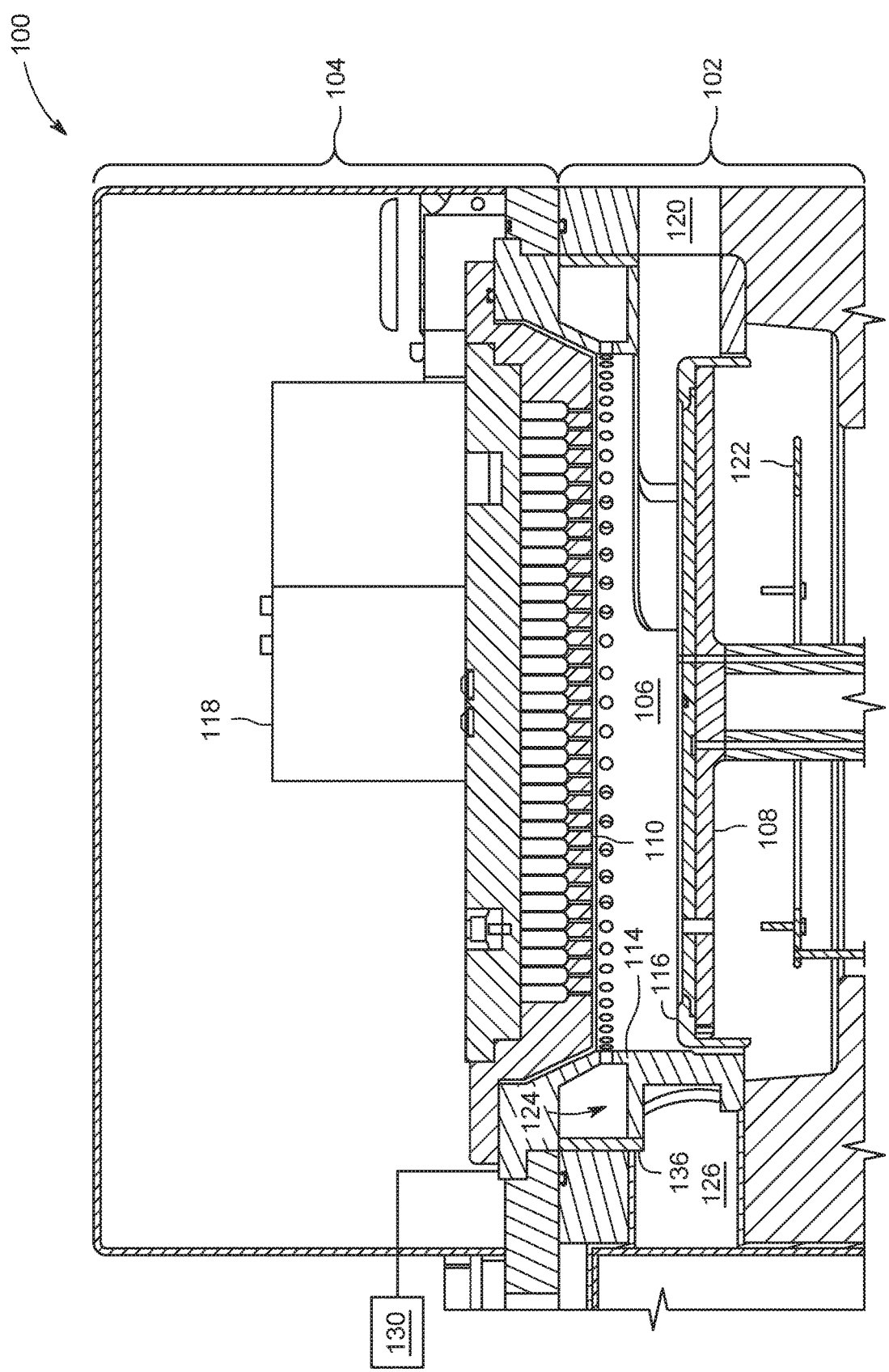
FIG. 1 depicts a schematic side cross-sectional view of a process chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a process kits for use in a substrate processing chamber are provided herein. In some embodiments, a process kit includes a liner disposed about and proximate an edge of a substrate support to reduce or prevent unwanted deposition on chamber components while directing flow from a processing volume to a pumping port. The liner is coupled to one or more heating elements to advantageously heat the liner to reduce a temperature difference between an edge region of the substrate and the liner to improve temperature uniformity on the substrate being processed. In some embodiments, the one or more heating elements are independently controllable to advantageously control a temperature profile near the edge region of the substrate.

Examples of suitable processing chambers for incorporation of the teachings described herein include high dielectric constant (i.e., high k) and metal ALD deposition chambers available from Applied Materials, Inc., of Santa Clara, Calif., although other chambers available from Applied Materials, Inc. or other manufacturers may also benefit. The following process chamber description is provided for context and exemplary purposes, and should not be construed as limiting the scope of the disclosure.

FIG. 1 is a schematic view of a substrate processing chamber (process chamber 100) in accordance with some embodiments of the present disclosure. Process chamber 100 includes a chamber body 102 and a lid assembly 104 having a processing volume 106 defined within the chamber body 102 and beneath the lid assembly 104. A slit valve 120 in the chamber body 102 provides access for a robot (not shown) to deliver and retrieve a substrate, such as a 200, 300, 450 mm or the like semiconductor wafer, a glass substrate, or the like, to and from the process chamber 100.

A substrate support 108 supports a substrate on a substrate receiving surface in the process chamber 100. The substrate support 108 is mounted to a lift motor for raising and lowering the substrate support 108 and the substrate when disposed on the substrate support 108. A lift plate 122, connected to a lift motor, is mounted in the process chamber 100 to raise and lower lift pins movably disposed through the substrate support 108. The lift pins raise and lower the substrate over the surface of the substrate support 108. The substrate support 108 may include a vacuum chuck (not shown), an electrostatic chuck (not shown), or a clamp ring (not shown) for securing the substrate to the substrate support 108 during processing.

The temperature of the substrate support 108 may be adjusted to control the temperature of the substrate. For example, substrate support 108 may be heated using an embedded heating element, such as a resistive heater, or may be heated using radiant heat, such as heating lamps configured to provide heat energy to the substrate support 108.

In some embodiments, an edge ring 116 may be disposed atop a peripheral edge of the substrate support 108. The edge ring 116 includes a central opening sized to expose the support surface of the substrate support 108. The edge ring 116 may further include a skirt, or downwardly extending annular lip to protect the sides of the substrate support 108.

In some embodiments, a liner 114 is disposed along the interior walls (e.g., one or more sidewalls) of the chamber body 102 to protect the chamber body 102 from corrosive gases or deposition of materials during operation. The liner 114 includes one or more heating elements (see FIGS. 2A and 2B) coupled to a heater power source 130. The heater power source 130 may be a single power source or a plurality of power sources coupled to respective ones of the one or more heating elements. In some embodiments, a shield 136 is disposed about the liner 114 to protect the chamber body 102 from corrosive gases or deposition of materials. In some embodiments, the liner 114 and the shield 136 define a pumping volume 124. The liner 114 includes a plurality of openings to fluidly couple the pumping volume 124 to the processing volume 106. In such embodiments, the pumping volume 124 is further fluidly coupled to a pump port 126 to facilitate evacuation of gases from the process chamber 100 and maintaining a predetermined pressure or pressure range inside the process chamber 100 via a vacuum pump coupled to the pump port 126.

A gas delivery system 118 is coupled to the lid assembly 104 to provide a gas, such as a process gas and/or a purge gas, to the processing volume 106 through a showerhead 110. The showerhead 110 is disposed in the lid assembly 104 generally opposite the substrate support 108 and includes a plurality of gas distribution holes to provide process gases to the processing volume 106.

Components of the process chamber 100 that are exposed to the processing volume and which undergo periodic maintenance and/or replacement over time are referred to herein as process kits. Process kits include, but are not limited to, the liner 114, the shield 136, and the edge ring 116.

In an illustrative processing operation, a substrate is delivered to the process chamber 100 through the slit valve 120 by a robot (not shown). The substrate is positioned on the substrate support 108 through cooperation of the lift pins and the robot. The substrate support 108 raises substrate into close opposition to a lower surface of the showerhead 110. A first gas flow may be injected into the processing volume 106 by the gas delivery system 118 together or sequentially (e.g., in pulses) with a second gas flow. The first gas flow may contain a continuous flow of a purge gas from a purge gas source and pulses of a reactant gas from a reactant gas source or may contain pulses of a reactant gas from the reactant gas source and pulses of a purge gas from the purge gas source. The second gas flow may contain a continuous flow of a purge gas from a purge gas source and pulses of a reactant gas from a reactant gas source or may contain pulses of a reactant gas from a reactant gas source and pulses of a purge gas from a purge gas source. The gas is then deposited on the surface of substrate. Excess gas, by-products, and the like flow through the pumping volume 124 to the pump port 126 and are then exhausted from process chamber 100.

Figure 2A:
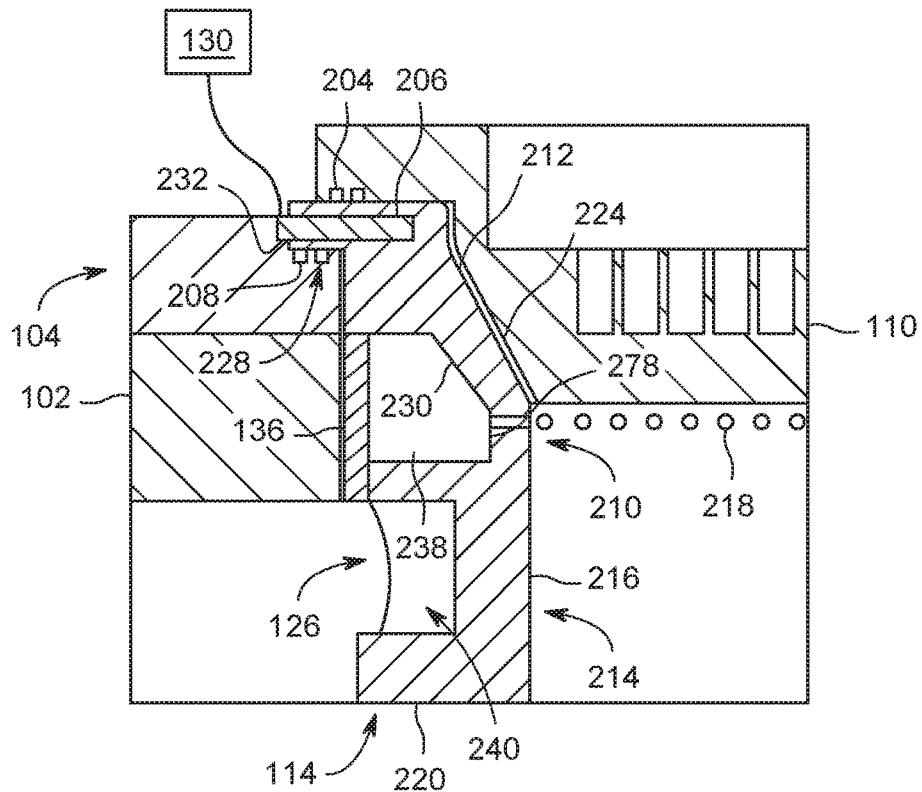
FIG. 2A depicts a partial schematic side cross-sectional view of a process chamber in accordance with some embodiments of the present disclosure.

FIG. 2A depicts a partial schematic side cross-sectional view of a process chamber including the liner 114 described above in accordance with some embodiments of the present disclosure. In some embodiments, the liner 114 and the shield 136 subassembly has minimal contact with the chamber body 102 and the lid assembly 104 to minimize heat loss to the chamber body 102 and the lid assembly 104. In some embodiments, the liner 114 and the shield 136 are both spaced from the chamber body 102. For example, a first gap is disposed between the shield 136 and the chamber body 102. In some embodiments, the first gap is about 30 mil to about 50 mil. In some embodiments, a second gap is disposed between an outer sidewall of the annular body 220 and the lid assembly 104. In some embodiments, the second gap is about 30 mil to about 50 mil. In some embodiments, a third gap is disposed between a lower surface of the annular body 220 and the chamber body 102. In some embodiments, the third gap is about 30 mil to about 50 mil.

The liner 114 includes an annular body 220 disposed about the substrate support 108. In some embodiments, the annular body 220 is made of a material having a thermal conductivity of at least about 200 W/mK. In some embodiments, the annular body 220 is made of aluminum, for example, aluminum 6061 or aluminum 6063. In some embodiments, annular body 220 includes an upper portion 210, a lower portion 214, and a central opening 216 through the upper portion 210 and the lower portion 214. In some embodiments, an outer sidewall of the upper portion 210 includes an annular recess 278 that forms, together with the shield 136, a first plenum 238 disposed between an inner surface of the shield 136 and surfaces of the annular recess 278. In some embodiments, the surfaces defined by the annular recess 278 include sidewalls 230. In some embodiments, an upper flange 228 extends radially outward from a top of the upper portion 210 of the annular body 220 to rest on the lid assembly 104. The upper flange 228 defines an outer diameter of the annular body 220. In some embodiments, the sidewalls 230 comprise a first portion that is substantially vertical and a second portion that extends upward and radially outward. In some embodiments, the annular body 220 includes a plurality of first holes 218 disposed through sidewalls 230 of the annular body 220. The plurality of first holes 218 are configured to facilitate flow from the processing volume 106 to the pump port 126.

In some embodiments, an inner surface 212 of the upper portion 210 has a profile corresponding to a profile of an outer surface 224 of the showerhead 110. In some embodiments, there is a gap between the inner surface 212 of the upper portion 210 and the outer surface 224 of the showerhead 110 to reduce thermal coupling between the liner 114 and the showerhead 110. In some embodiments, the pumping volume 124 includes the first plenum 238 and a second plenum 240. The second plenum 240 is defined by the shield 136 and sidewalls of the lower portion 214 as described in greater detail below with respect to FIG. 4.

In some embodiments, the upper portion 210 includes one or more openings 232 to accommodate one or more heating elements. In some embodiments, as shown in FIG. 2A, the one or more heating elements include one or more heater rods 206 to heat the annular body 220. In some embodiments, the heater rods 206 are disposed axisymmetrically about the annular body 220. In some embodiments, the heater rods 206 can provide about 75 watts to about 125 watts of power each. In some embodiments, the annular body 220 can be heated up to 300 degrees Celsius. The heater rods 206 may be individually controlled or may be connected in series. In some embodiments, the plurality of heater rods 206 extend radially inward from an outer sidewall of the upper flange 228. In some embodiments, the plurality of heater rods 206 extend substantially horizontally into the upper portion 210.

In some embodiments, the lid assembly 104 includes one or more o-ring grooves 208 to accommodate one or more o-rings at an interface between the lid assembly 104 and the annular body 220. In some embodiments, the showerhead 110 includes one or more o-ring grooves 204 to accommodate one or more o-rings at an interface between the showerhead 110 and the annular body 220.

Figure 2B:
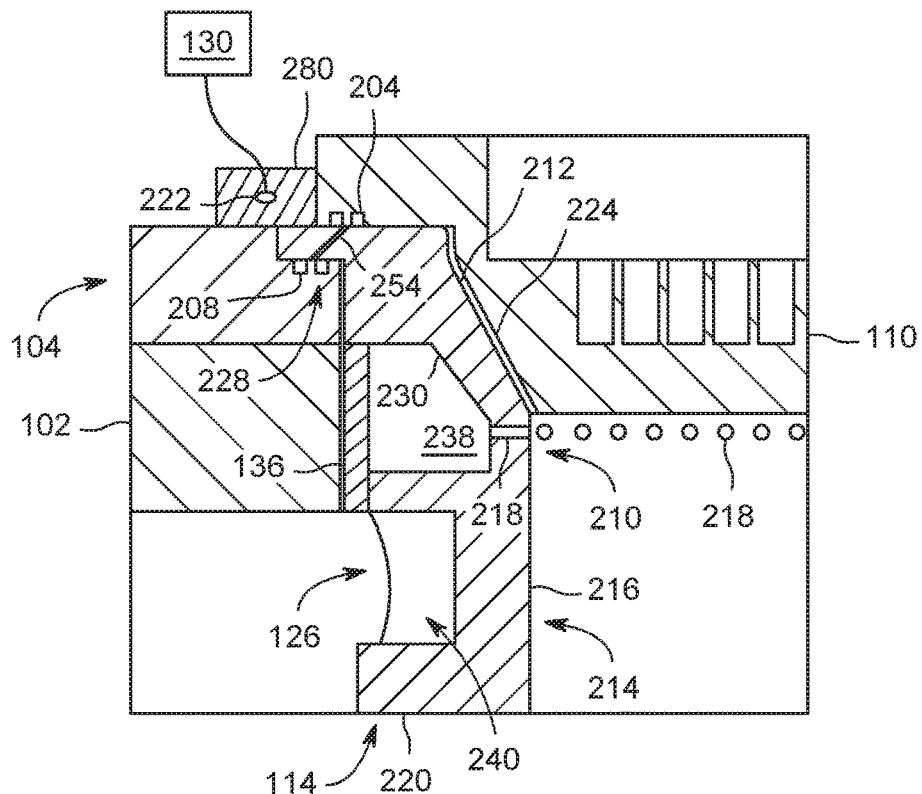
FIG. 2B depicts a partial schematic side cross-sectional view of a process chamber in accordance with some embodiments of the present disclosure.

FIG. 2B depicts a partial schematic side cross-sectional view of a process chamber in accordance with some embodiments of the present disclosure. In some embodiments, as shown in FIG. 2B, the liner 114 includes a ring 280 removeably coupled to the upper portion 210 of the annular body 220. The ring 280 includes one or more heating elements 222 to heat the liner 114. In some embodiments, the ring 280 is removeably coupled to an upper surface of the upper flange 228 of the upper portion 210. In some embodiments, the one or more heating elements 222 is a resistive heater embedded in the ring 280. In some embodiments, the one or more heating elements 222 are a plurality of heater rods disposed in the ring 280. The ring 280 advantageously facilitates the removal and servicing of the ring 280 and heater rods without having to remove the liner 114 entirely.

In some embodiments, a differential pumping line 254 extends through the annular body 220 from between a pair of the o-ring grooves 204 to a pair of the o-ring grooves 208. The differential pumping line 254 is configured to facilitate differential pumping to ensure that any process gases or byproducts trapped between the pair of o-ring grooves 204 and the pair of o-ring grooves 208 are exhausted to the pump port 126. In some embodiments, the differential pumping line 254 extends radially outward from between the pair of o-ring grooves 204 to between the pair of o-ring grooves 208.

Figure 3:
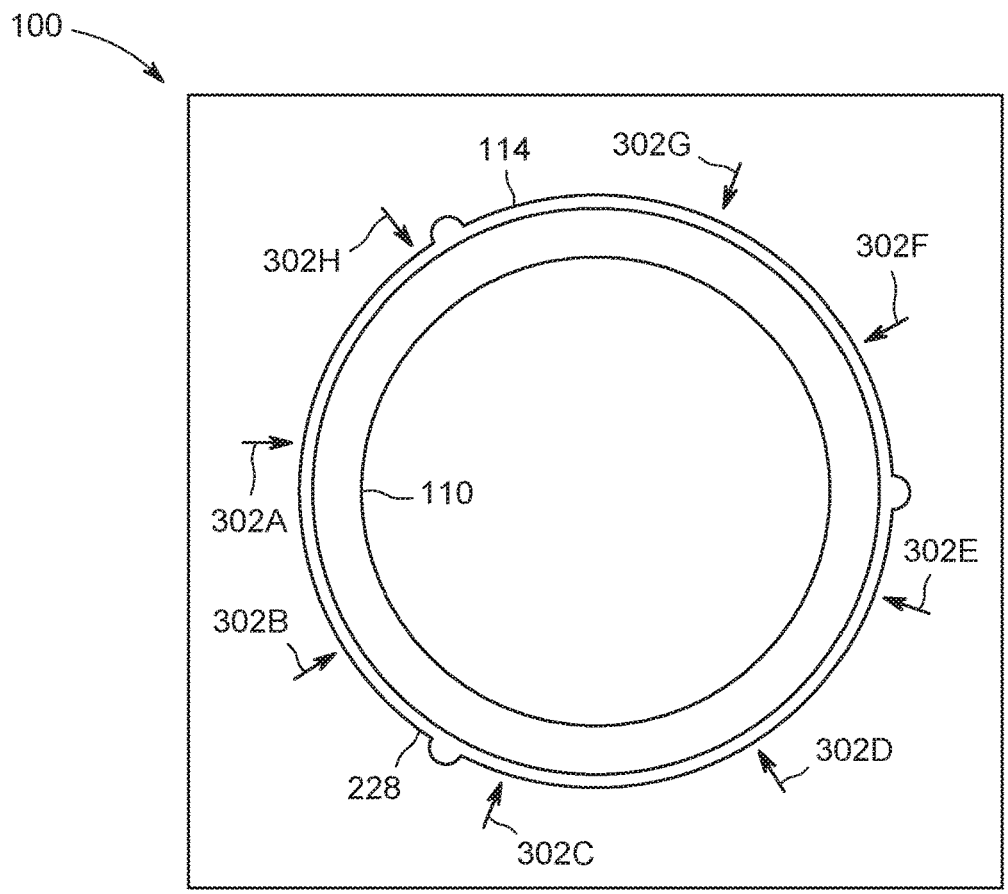
FIG. 3 depicts a schematic top view of a process chamber in accordance with some embodiments of the present disclosure.

FIG. 3 depicts a schematic top view of a process chamber in accordance with some embodiments of the present disclosure. In some embodiments, the plurality of heater rods 206 are arranged about the liner 114 at different angular locations to heat the liner 114. In some embodiments, the plurality of heater rods 206 includes eight heater rods. In some embodiments, arrows 302A-H depict corresponding locations of the plurality of heater rods 206 about the liner 114. While FIG. 3 depicts locations of eight heater rods, more or less heater rods 206 may be used. In some embodiments, the plurality of heater rods 206 are arranged axisymmetrically in the upper flange 228 of the annular body 220. In some embodiments, the plurality of heater rods are arranged axisymmetrically in the ring 280.

Figure 4:
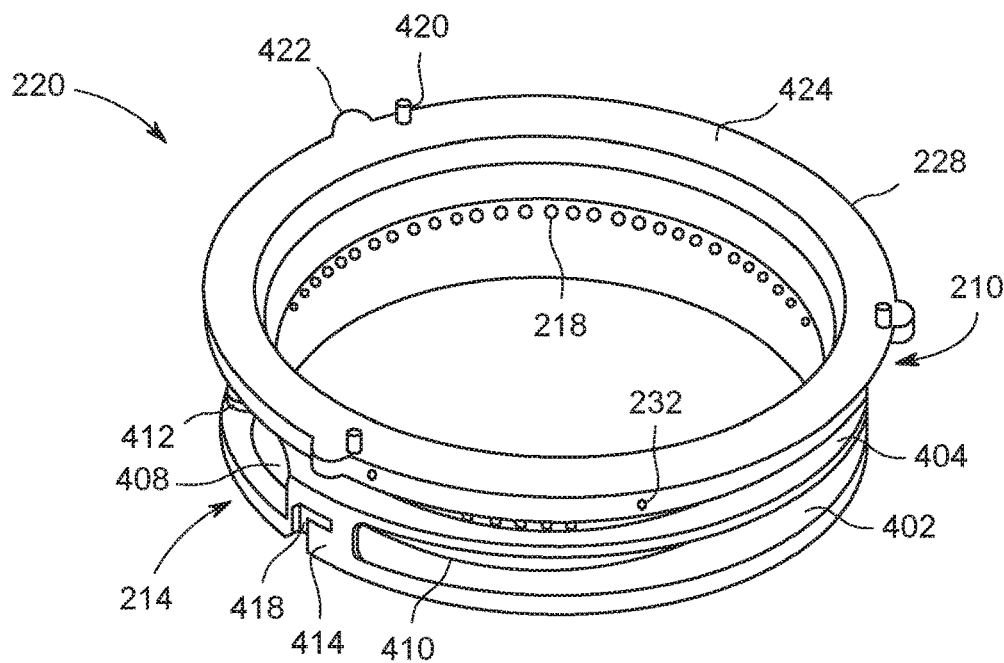
FIG. 4 depicts an isometric top view of a process kit in accordance with some embodiments of the present disclosure.

FIG. 4 depicts an isometric top view of a process kit in accordance with some embodiments of the present disclosure. In some embodiments, the lower portion 214 of the annular body 220 includes a lower flange 402 and an upper flange 404 and a sidewall 408 disposed between the lower flange 402 and the upper flange 404. In some embodiments, the sidewall 408 includes a cutout 410 to accommodate a substrate therethrough. In some embodiments, the lower portion 214 includes one or more coupling surfaces 414 having features configured to removeably couple the liner 114 to the shield 136. In some embodiments, the one or more coupling surfaces 414 are coplanar with an outer surface of the lower flange 402 and an outer surface of the upper flange 404. In some embodiments, the one or more coupling surfaces 414 include a slot 418 to accommodate a key (see FIG. 5) of the shield 136. In some embodiments, the slot 418 is L-shaped. In some embodiments, the one or more coupling surfaces 414 include two coupling surfaces disposed on opposite sides of the lower portion 214. In some embodiments, the cutout 410 extends between adjacent one or more coupling surfaces 414. In some embodiments, the upper flange 404 includes recesses 412 extending radially inward from an outer surface of the upper flange 404. In some embodiments, the recesses 412 are disposed on opposite sides of the upper flange 404. The recesses 412 are configured to direct flow from the upper portion 210 to the lower portion 214.

In some embodiments, the annular body 220 includes a plurality of alignment pins 420 extending from an upper surface 424 of the annular body 220. In some embodiments, the plurality of alignment pins 420 includes three pins. In some embodiments, the upper flange 228 includes a plurality of ears 422 extending radially outward from the upper flange 228.

Figure 5:
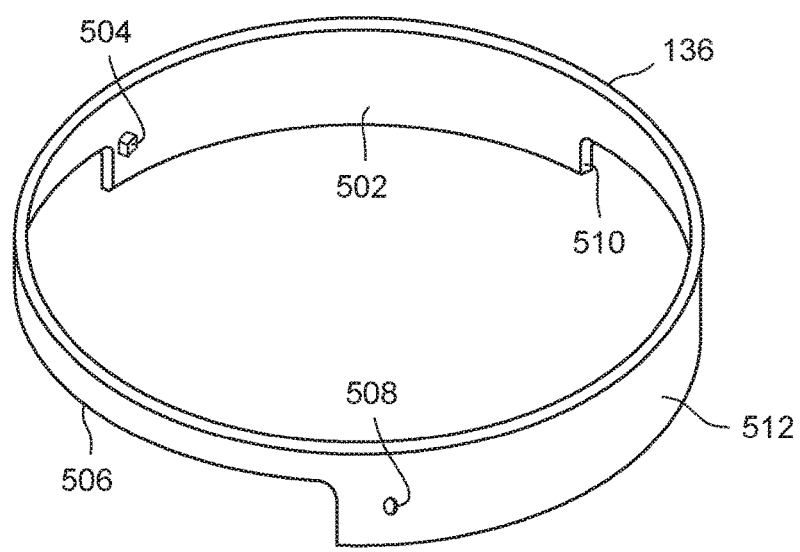
FIG. 5 depicts an isometric top view of a process kit in accordance with some embodiments of the present disclosure.

FIG. 5 depicts an isometric top view of the shield 136 of a process kit in accordance with some embodiments of the present disclosure. The shield 136 can be made out of the same types of material as the liner 114. In some embodiments, the shield 136 is made of the same material as the liner 114 or a material having a similar coefficient of thermal expansion as the liner 114 to reduce or prevent mechanical stress therebetween when the shield 136 and the liner 114 are heated or cooled. In some embodiments, the shield 136 includes one or more keys 504 disposed on an inner surface 502 of the shield and configured to enter corresponding slots 418 of the annular body 220 to removeably couple the shield 136 to the liner 114. The one or more keys 504 may be formed with the shield 136 or otherwise fastened, bonded, or coupled to the shield 136. In some embodiments, the shield 136 includes a fastener opening 508 for each of the one or more keys 504. Each one of the one or more keys 504 may be secured to the shield 136 via a fastener extending from an outer surface 512 of the shield 136 and into each one of the one or more keys 504 through the fastener opening 508. In some embodiments, the shield 136 includes a cutout 506 to accommodate a substrate therethrough. In some embodiments, the cutout 506 has a size similar to the cutout 410 of the annular body 220. In some embodiments, the shield 136 includes an exhaust port 510. In some embodiments, the exhaust port 510 is disposed opposite the cutout 506.

In some embodiments, the upper portion 210 and the shield 136 define the first plenum 238. In some embodiments, the inner surface 502 of the shield 136, the sidewall 230 of the upper portion 310, and the upper flange 404 of the lower portion 314 define the first plenum 238. The first plenum 238 is fluidly coupled to the plurality of first holes 218. In some embodiments, the plurality of first holes 218 vary in size such that first holes that are disposed away from the pump port 126 are larger than first holes that are disposed closer to the pump port 126 to advantageously evacuate the processing volume 106 in a uniform manner.

In some embodiments, the lower portion 214 and the shield 136 define the second plenum 240. In some embodiments, the inner surface 502 of the shield 136 and the sidewall 408 of the lower portion 214 define the second plenum 240 between the upper flange 404 and the lower flange 402. The recesses 412 of the upper flange 404 provide an opening between the first plenum 238 and the second plenum 240 to direct a flow from the first plenum 238 to the second plenum 240. In some embodiments, the recesses 412 of the upper flange 404 comprise two recesses 412. In some embodiments, the recesses 412 are disposed on opposite sides of the upper flange 404. In operation, flow from the processing volume 106 is directed through the plurality of first holes 218 into the first plenum 238, from the first plenum 238 through the recesses 412 and into the second plenum 240, and from the second plenum 240 through the exhaust port 510 and into the pump port 126. In some embodiments, the exhaust port 510 is advantageously disposed substantially equidistant between adjacent recesses 412 to direct flow from the recesses 412 to the exhaust port 510 in a uniform manner.

Figure 6:
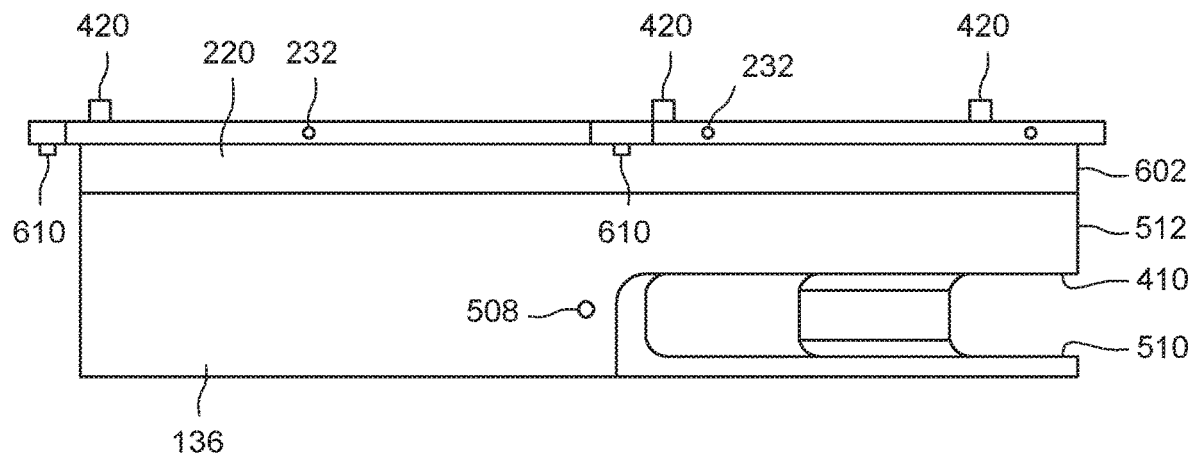
FIG. 6 depicts a side elevation view of a process kit in accordance with some embodiments of the present disclosure.

FIG. 6 depicts a side elevation view of a process kit in accordance with some embodiments of the present disclosure. As shown in FIG. 6, the shield 136 is removeably coupled to the annular body 220. In some embodiments, the shield 136, when coupled to the annular body 220, abuts a lower surface of the upper portion 210 of the annular body 220. In some embodiments, and the outer surface 512 of the shield 136 is coplanar with an outer surface 602 of the upper portion 210. In some embodiments, a plurality of alignment pins 610 extend from a lower surface of the upper flange 228. In some embodiments, the plurality of alignment pins 610 are configured to extend into slots disposed in the lid assembly 104 to align the annular body 220 with the lid assembly 104. In some embodiments, each pin of the plurality of alignment pins 610 extends from a lower surface of a corresponding ear of the plurality of ears 422.

Figure 7:
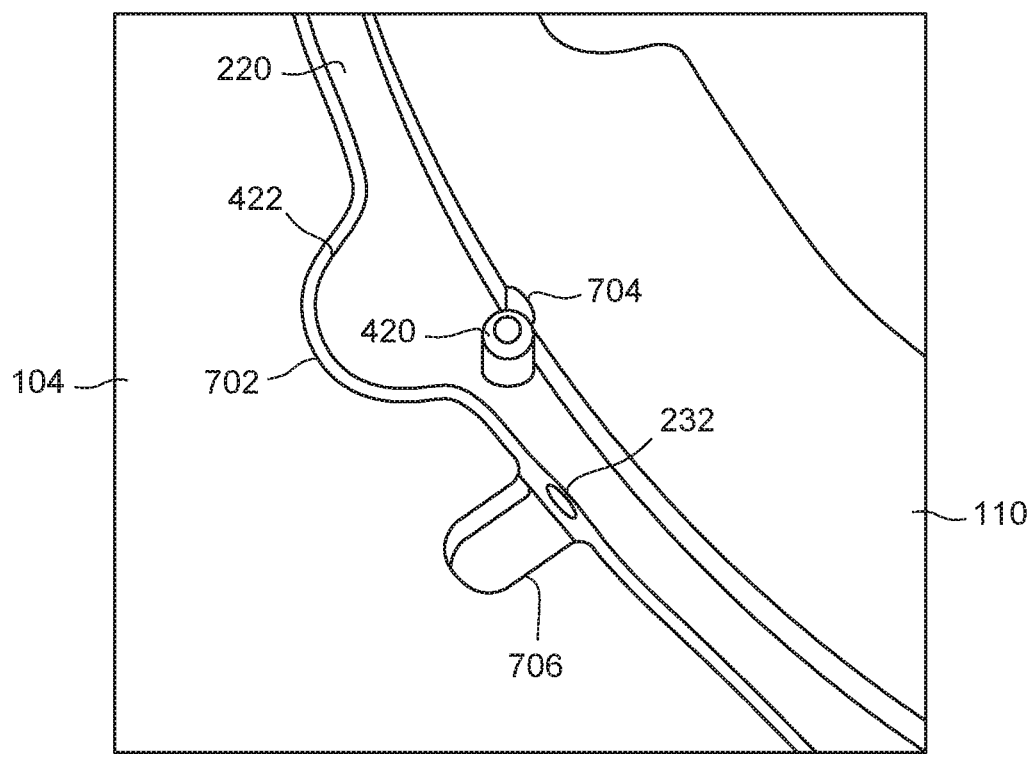
FIG. 7 depicts a partial isometric top view of a process chamber in accordance with some embodiments of the present disclosure.

FIG. 7 depicts a partial isometric top view of a process chamber in accordance with some embodiments of the present disclosure. In some embodiments, the plurality of ears 422 of the upper portion 210 are configured to extend into grooves 702 that correspond to the plurality of ears 422 to align the annular body 220 to the lid assembly 104. In some embodiments, the plurality of ears 422 are arranged asymmetrically such that the annular body 220 may be aligned with the lid assembly 104 in only one orientation. In some embodiments, the plurality of alignment pins 420 extending from the upper flange 228 are configured to interface with a feature 704 formed in the showerhead 110 to align the annular body 220 to the showerhead 110. In some embodiments, the feature 704 is a recess extending radially inward from an outer surface of the showerhead 110. In some embodiments, the lid assembly 104 includes one or more slots 706 at locations corresponding with locations of the one or more openings 232 of the upper portion 210 to accommodate one or more heating elements (e.g., heater rods 206). In some embodiments, the one or more openings 232 extend radially inward from an outer sidewall of the upper flange 228.

While the foregoing is directed to embodiments of the present disclosure, other and further embodiments of the disclosure may be devised without departing from the basic scope thereof.

The invention claimed is:

1. A process kit for use in a substrate processing chamber, comprising:
   an annular body configured to surround a substrate support, wherein the annular body has an upper portion, a lower portion, and a central opening through the upper portion and the lower portion, wherein the upper portion includes sidewalls coupled to an upper flange that defines an outer diameter of the annular body, wherein the upper portion includes a plurality of first holes disposed through the sidewalls, and wherein the upper portion includes one or more heating elements; and
   a shield disposed about the annular body, wherein the shield includes an exhaust port fluidly connected to the plurality of first holes, wherein at least one of:
   the shield includes a key configured to enter a slot in the annular body to removably couple the shield to the annular body,
   the upper flange of the upper portion includes a plurality of ears extending radially outward from the upper flange to align the annular body to a lid assembly, or
   the upper flange includes a plurality of pins extending from an upper surface of the upper flange to align the annular body to a showerhead.

2. The process kit of claim 1, wherein the one or more heating elements comprises a plurality of heater rods disposed about the annular body at different angular locations to heat the annular body, wherein each rod of the plurality of heater rods is independently controllable.

3. The process kit of claim 2, wherein the plurality of heater rods are arranged axisymmetrically in the upper flange of the upper portion.

4. The process kit of claim 2, wherein the plurality of heater rods includes eight heater rods.

5. The process kit of claim 2, wherein the annular body includes a ring coupled to the upper flange of the upper portion, and wherein the plurality of heater rods are disposed in the ring.

6. The process kit of claim 1, wherein the annular body includes a ring coupled to the upper portion, and wherein the ring includes a resistive heater to heat the annular body.

7. A process kit for use in a substrate processing chamber, comprising:
an annular body configured to surround a substrate support, wherein the annular body has an upper portion, a lower portion, and a central opening through the upper portion and the lower portion, wherein the upper portion includes a plurality of first holes disposed through sidewalls of the upper portion, and wherein the upper portion includes one or more heating elements; and
a shield disposed about and removably coupled to the annular body, wherein the shield includes an exhaust port fluidly connected to the plurality of first holes, and wherein the annular body and the shield both include a cutout to accommodate a substrate therethrough.

8. The process kit of claim 7, wherein an outer sidewall of the upper portion includes an annular recess to define a first plenum between an inner surface of the shield and surfaces defined by the annular recess.

9. The process kit of claim 8, wherein the lower portion includes a lower flange and an upper flange and a sidewall disposed between the lower flange and the upper flange, wherein the inner surface of the shield and the sidewall of the lower portion define a second plenum fluidly coupled to the first plenum via a recesses disposed on opposite sides of the lower portion.

10. The process kit of claim 7, wherein the one or more heating elements comprises a plurality of heater rods disposed in the upper portion and about the annular body to heat the annular body.

11. The process kit of claim 7, wherein the annular body includes a ring coupled to the upper portion, and wherein the one or more heating elements comprises at least one of a resistive heater disposed in the ring or a plurality of heater rods disposed in the ring.

12. The process kit of claim 7, wherein the annular body and the shield are made of aluminum.

13. A process chamber, comprising:
a chamber body defining a processing volume, wherein the chamber body includes a lid;
a substrate support disposed in the processing volume;
an annular body disposed about the substrate support, wherein the annular body has an upper portion, a lower portion, and a central opening through the upper portion and the lower portion, wherein the annular body includes a plurality of first holes disposed through sidewalls of the annular body, and wherein the upper portion includes one or more heating elements, wherein the one or more heating elements comprise at least one of a plurality of heater rods disposed axisymmetrically about the annular body or a resistive heater disposed in a ring coupled to the upper portion;
a shield disposed about and removably coupled to the annular body, wherein the shield includes an exhaust port fluidly connected to the plurality of first holes, wherein the annular body and the shield both include a cutout to accommodate a substrate therethrough; and
a showerhead disposed in the processing volume opposite the substrate support and on an upper surface of the annular body.

14. The process chamber of claim 13, wherein the plurality of heater rods extend radially inward from an outer sidewall of the upper portion.

15. The process chamber of claim 13, wherein the plurality of heater rods are disposed in the ring coupled to the upper portion.

16. The process chamber of claim 13, further comprising a pump port, wherein the upper portion and the shield define a first plenum, wherein the lower portion and the shield define a second plenum, and the first plenum is fluidly coupled to the pump port via the second plenum.

17. The process chamber of claim 13, wherein an inner surface of the upper portion has a profile corresponding to a profile of an outer surface of the showerhead.

\* \* \* \* \*